United States Patent [19]

Brossard et al.

[11] 4,270,189

[45] May 26, 1981

[54] READ ONLY MEMORY CIRCUIT

[75] Inventors: Michael E. Brossard, Rochester, Minn.; Dale A. Heuer, Longmont, Colo.; Philip T. Wu, Rochester, Minn.

[73] Assignee: International Business Machines Corporation, Armonk, N.Y.

[21] Appl. No.: 91,842

[22] Filed: Nov. 6, 1979

[51] Int. Cl.³ .................. G11C 7/00; G11C 7/06
[52] U.S. Cl. .................. 365/205; 365/189; 307/DIG. 3
[58] Field of Search .............. 365/205, 104, 189, 208; 307/279, 238, DIG. 3

[56] References Cited

U.S. PATENT DOCUMENTS

| 3,846,643 | 11/1974 | Chu et al. | 307/247 R |
| 4,031,524 | 6/1977 | Heeren | 365/205 |
| 4,053,873 | 10/1977 | Freeman et al. | 365/205 |

OTHER PUBLICATIONS

Wilson, "Cell Layout Boosts Speed of Low-Power 64-K Rom", *Electronics*, 3/30/78, pp. 96-99.
Itoh, et al., "A High-Speed 16K-Bit NMOSRAM", 1976 IEEE International Solid-State Circuits Conf., pp. 140-141, Digest of Tech. Papers.
Lee, "Cross-Coupled Latch for Memory Sensing", IBM Tech. Disc. Bul., vol. 17, No. 5, 10/74, pp. 1361-1362.

*Primary Examiner*—Stuart N. Hecker
*Attorney, Agent, or Firm*—Robert W. Lahtinen

[57] ABSTRACT

The disclosure shows a read only storage (ROS) formed of a matrix of rows and columns of field effect transistor (FET) devices which is personalized by the presence or absence of a gate at the memory device location. All circuits on the chip are controlled and restored to initial conditions by a single train of clock pulses including the row and column addresses, the array select and the output sensing. In addition the output signal is communicated directly to the output line control device without withdrawing current to set the outputs latch thereby making the output truely delayless.

2 Claims, 7 Drawing Figures

READ ONLY MEMORY CIRCUIT

DESCRIPTION

1. Field of the Invention

The present invention relates to read only storage or memory devices and more particularly to such a device having a delayless output with all control exercised by a single train of clock pulses.

Prior output latch circuits have commonly entailed circuit delays in establishing the validity of the output signal as the latch was set. Even delayless latch circuits were often only a matter of degree as some of the current used to establish the output signal was robbed to force the latch. Either of these conditions imposes circuit delays that compromise the speed of memory access and thereby lengthens the cycle time of the memory device.

2. Summary of the Invention

In the memory device of the present invention the signal at the output sense node is communicated directly to the output driver without the circuit delay of an intermediate device or being subjected to a current drain that would also occasion a delay in achieving an output signal level at such output driver.

The output circuit is further controlled by a single clock in contrast to the multiple clock inputs normally utilized. The single clock in addition to the output sense circuit provides all the clock timing and synchronization for the entire memory chip including array, row and column select as well as restoring the memory matrix to an initial condition intermediate memory access cycles.

The speed of the read only memory device is further enhanced in that as soon as the output sense node is at the proper level, the signal setting the latch may occur irrespective of whether the output line to the off-chip driver has reached a steady state condition.

Reducing the number of clock signals required to perform the logical functions of the chip circuitry simplifies the timing, reduces the cost of clock drivers and reduces the complexity of the interface circuitry.

The circuitry also includes an output enable input which may be activated at any time to disable the off chip driver while not affecting the state of the output latch. This ability affords additional function such as bidirectional interface capability by allowing adress inputs and data output to be OR-tied.

It is an object of the invention to provide a read only storage or memory device wherein total control is exercised by a single train of clock pulses.

It is a further object of the invention to provide a delayless latch wherein the output sense signal current is not partially consumed to set the output latch.

It is also an object of the invention to provide an output sense circuit for a memory device wherein the signal at the output sense node is communicated to the output driver without intermediate devices.

BRIEF DESCRIPTION OF THE DRAWING

FIG. 1 illustrates schematically the layout of a specific example of a high density read only storage (ROS) device formed on a single large scale integration chip and incorporating the present invention. The matrix 11 of field effect transistors (FET) is formed as 384 columns and 288 rows of single device memory locations arranged as 6 arrays of 64 columns each. Each array consists of every sixth column in the form of a gate line or word line each of which conects the gate locations of one vertical column of memory locations or FET devices within the matrix. The arrays are accordingly interleaved within the matrix.

Figure 1:
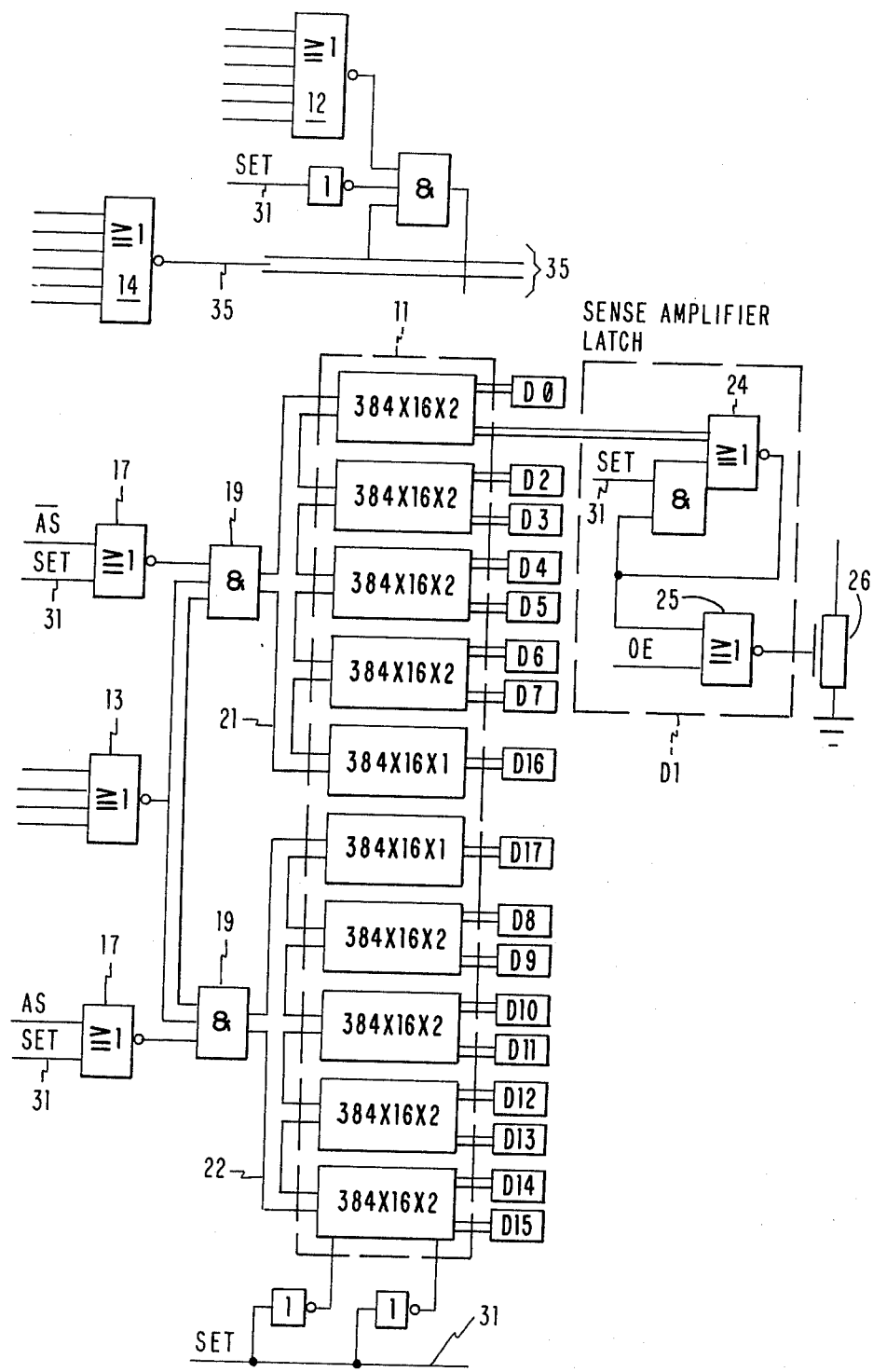
FIG. 1 is a schematic logic showing of the read only storage chip incorporating the present invention with, in most instances, representative circuit representations shown without redundancy.

The matrix 11 is addressed by a 16 bit address which is identified as bits A0 through A15. True and complement values of bits A0 through A5 connected to six NOR circuits 14 (one of which is shown) select the array with address bit A5 in an alternate embodiment being usable to address the upper or lower halves of the matrix if it is desired to address a smaller size word. The use of 6 bits of address permits 64 unique combinations of bit conditions and accordingly with 6 arrays on this memory chip it is possible for this 6 bit array select to address 10 and ⅔ such 6 array memory chips. The six address bits A6 through A11 provide the word line select to select one word line or column within the 64 lines of the addressed array. Address bits A12 through A15 select the row or rows.

The word line or column select within an addressed array is identified by the output of the addressed NOR circuit 12. The word line within the array is addressed by address bits A6 through A11.

Address bits A12 through A15 are decoded by 16 decode NOR circuits 13 (one of which is indicated) which select one of the 16 lines in bus 15. The NOR circuits 17 are not utilized when a 18 bit word output from the memory is used and address A5 comprises one of a six bit address for array select. However, when it is desired to use 9 bit words, address bit A5 is used in true and complement form with NOR blocks 17 and AND blocks 19 to select the upper half 21 or lower half 22 of the row select bus 15 and thereby the upper or lower halves of memory matrix 11. In the alternative 9 bit word embodiment the array select is reduced to a 5 bit address or 32 unique combinations of true and complement values which halves the array address-ability to 5 and ⅓ such 6 array memory chips.

The output from the matrix of memory devices is sensed by a series of eighteen output sense/amplifier latches D0 through D17. Each of the latches D0–D17 senses the output with respect to sixteen rows of memory devices, one row of such devices associated with each of the sixteen row select lines. The output of the collection NOR 24 is connected directly to the output device (NOR 25) for transimission to off chip driver 26 without any circuit delay occasioned by the setting of the output sense latch.

The matrix is organized with 384 columns and 288 rows of devices. In each of the blocks labeled 384×16×2, each of the sixteen row select lines 28 controls the line 29 (FIG. 2) which is connected to the drain electrodes of two adjoining rows of matrix FET memory devices and each of the two output sense amplifier/latch circuits includes a sixteen way collection NOR 24 the inputs of which are lines 30 each respectively connected to the source electrodes of one row of FET memory devices associated with each of the sixteen row lines 29. The blocks labeled 384×16×1 are similar except that each row line 29 is connected to the drain electrodes of one row of FET memory devices, and the single output sense amplifier latch circuit has a sixteen way NOR 24 that senses the presense of an output from all the memory devices of the block.

All the above circuits are part of a single large scale integration (LSI) chip formed on a single substrate. All the circuit functions of this memory chip are coordinated and driven by a single train of clock pulse signals on line 31 which is also labeled SET. This single pulse train controls the operation of the array select, word line decode, row select, output sense latch and the discharging of the array select lines intermediate memory access cycles.

Figure 2A:
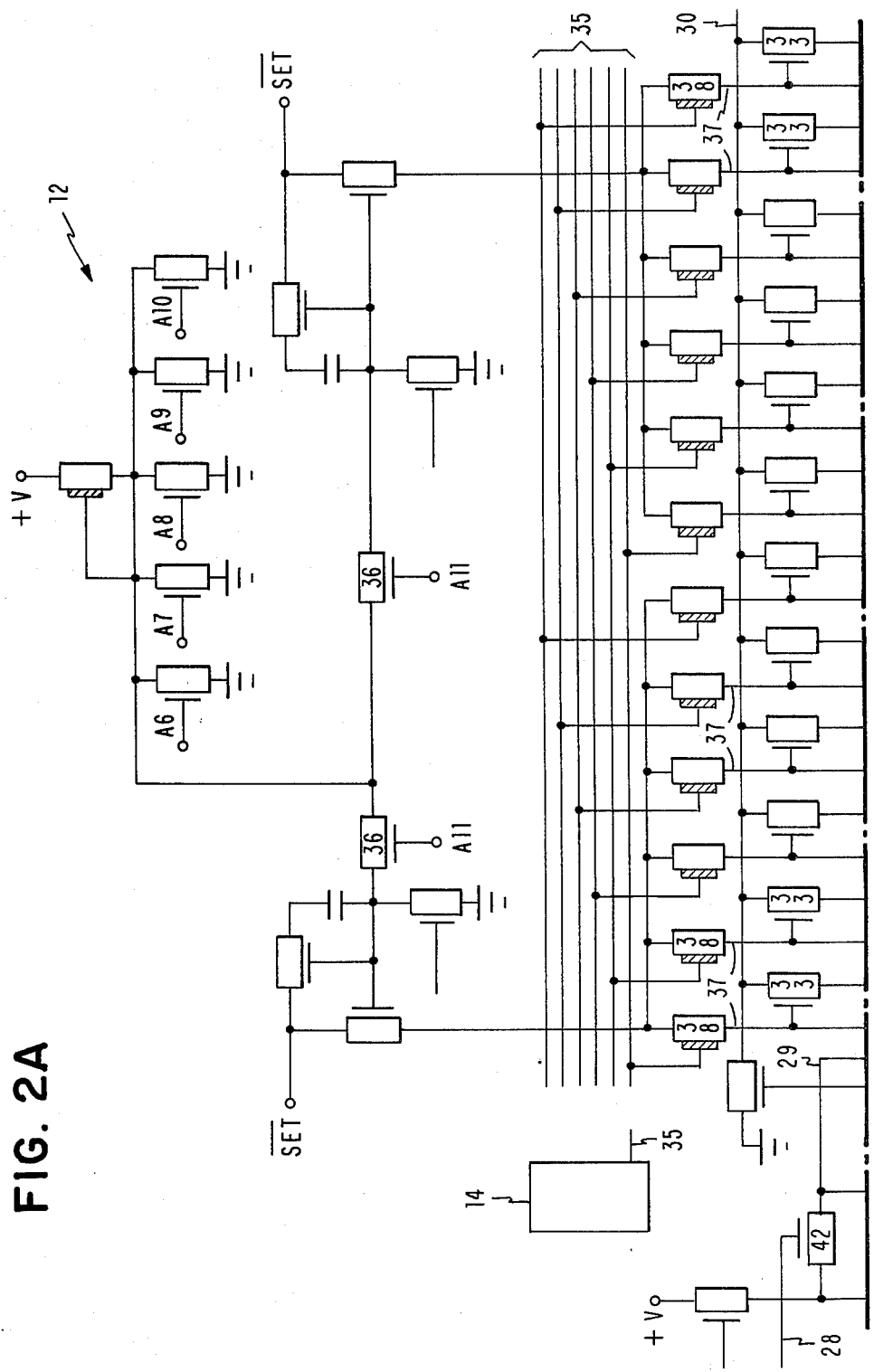
FIG. 2, composed of FIGS. 2A and 2B, shows portions of the logic level circuit diagram of FIG. 1 at the device level.
Figure 2B:
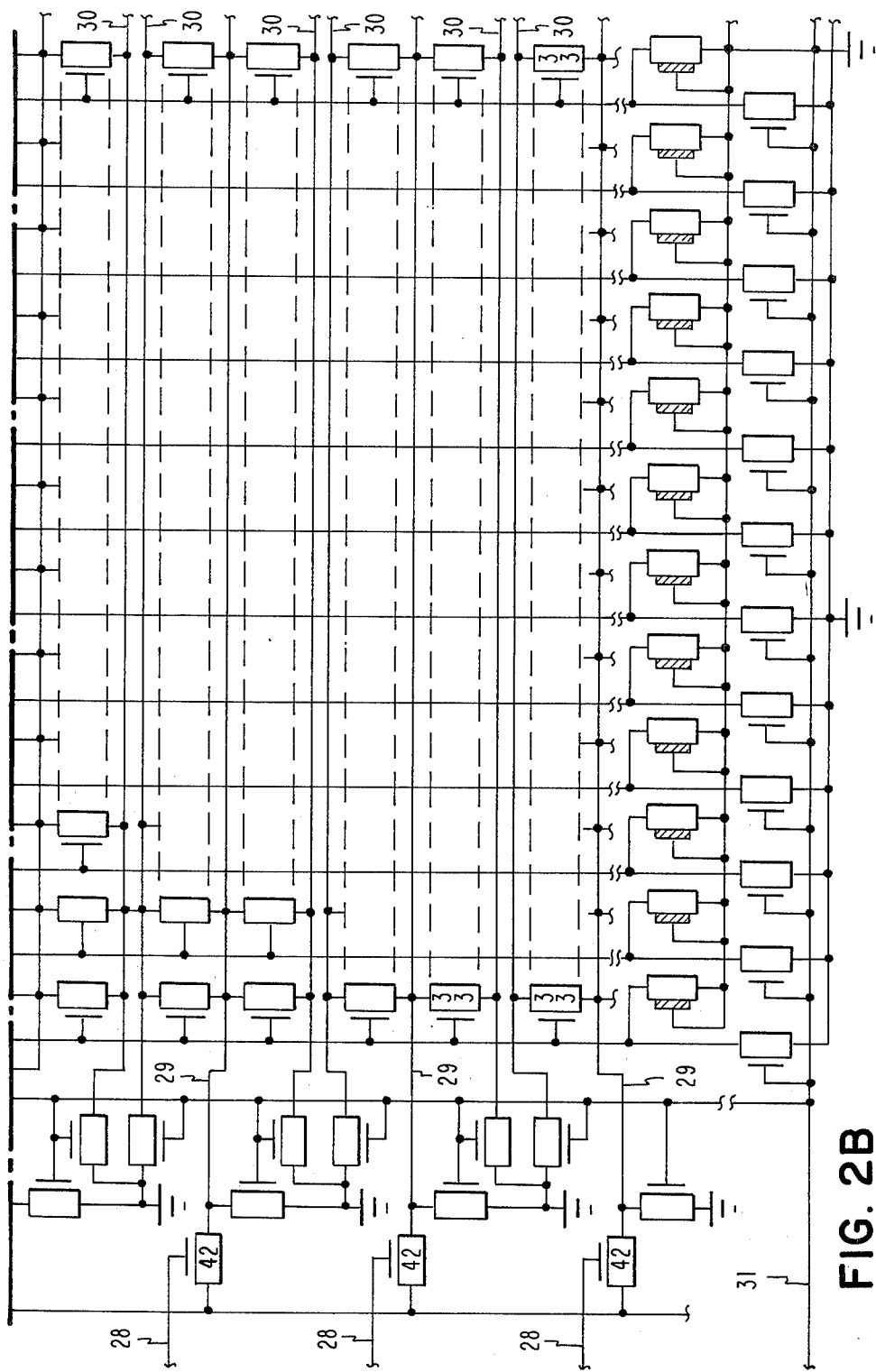

FIG. 2 shows a small portion of the matrix 11 including portions of twelve columns and seven rows memory location FET devices 33. The lines 28 are four of the sixteen row select lines that control lines 29 connected to the drain electrodes of rows devices 33 associated with the output sense amplifier latches D0 and D1. The selected row select line 28 controls a line 29 that, upon selection, provides a positive voltage to the drain electrode of the associated column selected FET devices 33 to cause the source line 30 connected thereto to be changed when the selected memory location FET 33 is personalized with a gate element.

The array select NOR circuits 14 select one of the six lines 35 if the matrix is being addressed. The word line select is effected by a series of 32 decode NOR circuits 12 (one of which is shown) each in combination wih a pair of decode doubler FET devices 36. Each decode NOR 12 identifies a group of twelve column gate lines 37, the decode doubler FET devices 36 select the group of six lines within the twelve and the array select lines 35 determines which of the FET devices 38 within the identified group of six will be activated and thereby apply a positive voltage +V to a single gate line 37 among the 384 of the matrix. The matrix 11 is personalized to two logic states during fabrication by selectively forming gates at the locations of FET devices 33. If a gate is present a first logical condition exists and if a gate is absent a second logical condition exists. If a gate is present at the selected FET memory location 33, a positive voltage will be transferred to the sense line 30 connected to the source electrode of the FET, and if a gate is absent no voltage charge will be transferred and the sense line will remain at ground potential.

Figure 3:
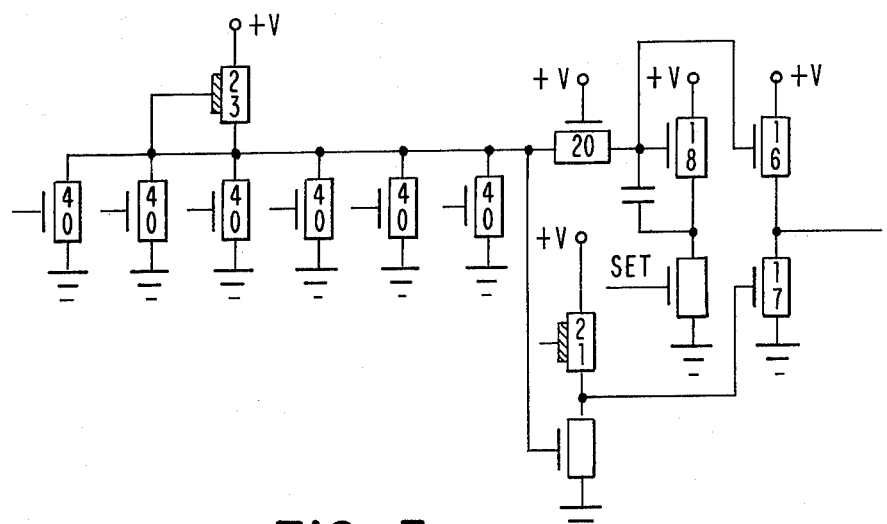
FIG. 3 illustrates one of six array select circuits utilized by the device of FIG. 1.

FIG. 3 shows one of six array select circuits including the six devices 40 of the decode NOR 14 which have the gates thereof respectively attached to true or complement values of the address signals A0 through A5. If one of the six circuits is selected all the signals applied to the gates of the FET devices 40 are at a down level causing a positive select voltage to be supplied at the output or array select line 35.

Figure 4:
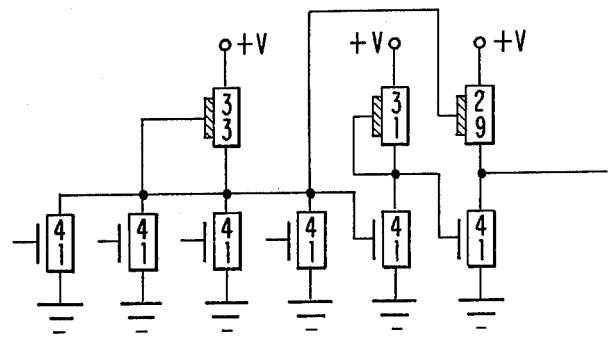
FIG. 4 shows one of sixteen row select circuits used by the device of FIG. 1.
Figure 6:
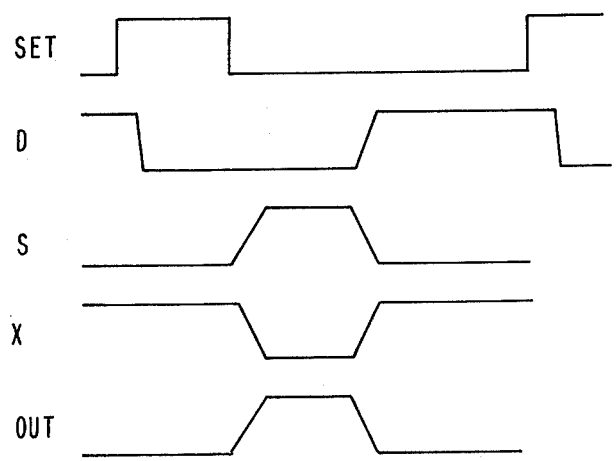
FIG. 6 is a timing diagram illustrating the single clock pulse train and the corresponding logical conditions at various nodes associated with the output sense latch circuit.

FIG. 4 shws one of sixteen decode circuits 13 for selecting one of sixteen row select lines 28. Each of the sixteen decode circuits has a unique combination of true and complement values of the address bits A12 through A15 respectively applied to the gates of FET devices 41 forming the NOR circuit 13. The selected row line decode circuit 13 (wherein the signals to all 4 FET gates are at a down level) causes a positive voltage to appear on the output line 28 that in turn appears at the gate of the connected FET devices 42 (FIG. 2) causing the selected row drain lines 29 to become charged.

Figure 5:
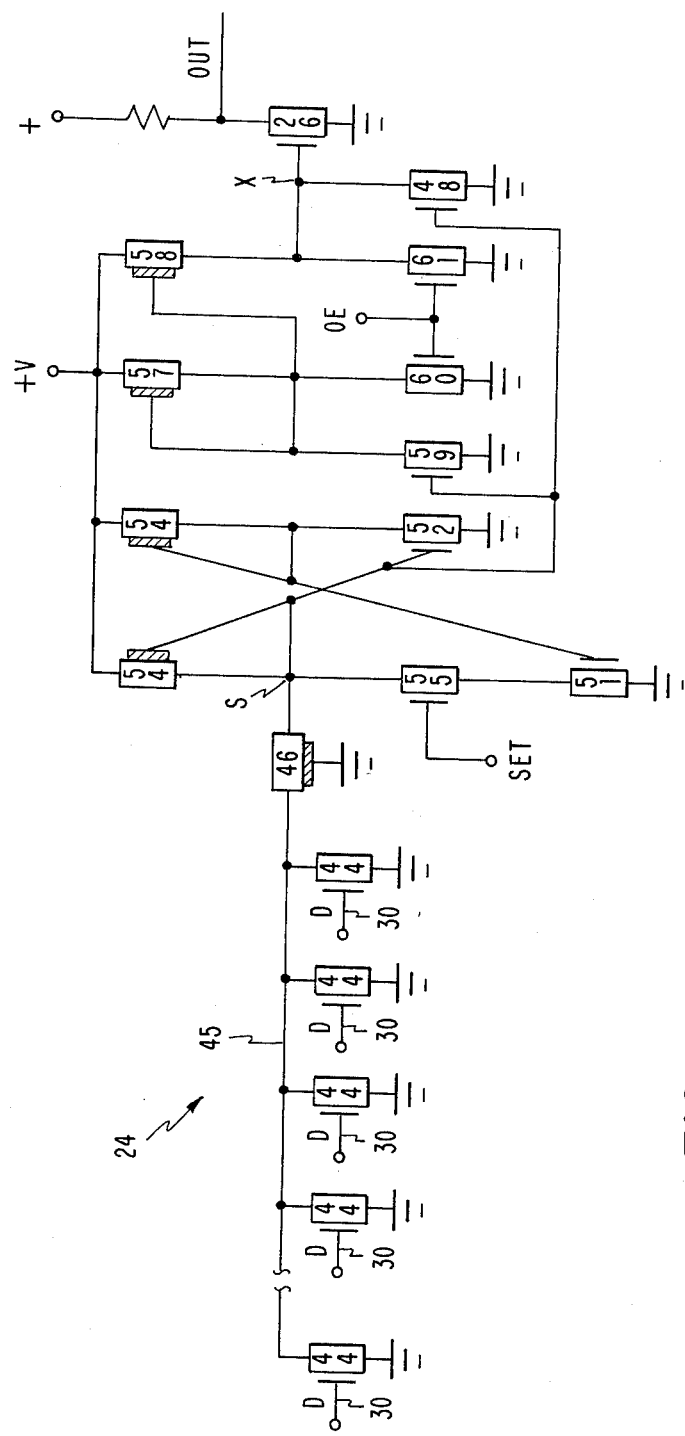
FIG. 5 shows one of eighteen output sense latch circuits of the device of FIG. 1.

One of the eighteen output sense amplifier latches D0 through D15 is shown in FIG. 5. The FET devices 44, only a part of which are shown, comprise a 16 way collection NOR circuit 24 wherein one sense line 30 is connected to each FET gate electrode. If the addressed memory location FET 33 in the matrix is personalized with a gate the transferred change causes the connected collection NOR FET 44 to become conductive grounding the line 45 and if a gate is not present at the memory location, the line remains at a positive level. The depletion mode FET 46 functions as an amplifier to increase the performance of the memory circuit.

The condition at the node S is communicated directly to the gate of FET 48 and FET 59, to provide the sensed condition immediately to the line 49 (node X), which is connected to the off chip driver 26 without the circuit delays entailed in setting a latch. The latch is formed of a pair of cross connected FET devices 51,52, a pair of load FET devices 54. When the set signal on the gate of device 55 goes high, the latch will be set to the condition of node S just prior to such positive going signal. Devices 48, 57, 58, 59 function as a buffer driver and devices 60, 61 operate as an output enable. The output enable signal to the gates of devices 60, 61 may be brought to a positive level at any time to disable the off chip driver 26 while not affecting the state of the output sense latch.

SET on line 31 is an external clock signal or train of pulses required for the operation of all memory chip circuits. When the SET signal is at an up or positive level all row select drain lines 29, output sense source lines 30 and column select gate lines 37 in the matrix 11 are restored to ground potential. Further, with SET positive the communication of the gate or word line decode circuits, array select circuits and row select decode circuits with the matrix is disabled. When the set signal goes low, the memory is addressed and the output sense latch sense nodes S become valid which condition is communicated directly to output node X. When set goes positive or high, the latch composed of devices 51, 52, 54 will be set to the condition of node S just prior to the SET transition from low to high. As long as SET remains high the latch will remain stable and set to the proper state.

The output sense amplifier latch circuit achieves the desired logical function with a minimum number of devices which results in a corresponding reduction in the required layout area. The circuit is a truly delayless latch scheme since setting the latch does not impede the transfer of information to the output by consuming power required to charge the gate of the off chip driver in order to force the latch to a desired state. Setting the latch occurs for "free" in the sense that the external clock SET signal that feeds all other internal ROS circuits is utilized.

While a preferred embodiment of the invention has been illustrated and described, it is to be understood that the invention is not to be limited to the precise construction herein disclosed and the right is reserved to all changes and modifications coming within the scope of the invention as defined in the appended claims.

Having thus described our invention, what we claim as new, and desire to secure by Letters Patent is:

1. A semiconductor output sense circuit for providing a latched output signal comprising:
   (a) a sense node;
   (b) an output driver;
   (c) means communicating the condition at said sense node to said output driver;
   (d) latch means for maintaining the condition at said sense node at said output driver when said latch means is set;
   (e) single clock means for providing a sequence of clock pulse cycles wherein each clock pulse cycle iniates and terminates said set condition of said latch means; and
   (f) wherein said latching means comprises
      a pair of cross connected field effect transistors;
      a pair of load field effect transistors each operatively connected to one of said cross connected field effect transistors;
      said sense node connected to the source of one load field effect transistor and the gating electrode of the cross connected field effect transistor associated with the other of said load field effect transistors; and
      a set/reset field effect transistor with its drain connected to said sense node, its source connected to the drain of said cross connected field effect transistor associated with said one load field effect transistor and the gating electrode connected to said clock means.

2. A read only memory including a matrix formed by columns and rows of devices on a single substrate with a first series of conductors respectively interconnecting columns of said devices, a second series of conductors respectively interconnecting rows of said devices and a third series of conductors each respectively connected to a plurality of said devices to sense the output of selected devices comprising
   (a) first decode means for selecting one of said first series of conductors;
   (b) second decode means for selecting one of said second series of conductors;
   (c) output sense means for sensing the logical conditions of said third series of conductors; and
   (d) single reset means as a train of clock pulses alternating between a logical 1 condition and a logical 0 condition for resetting and enabling said first, second and third series of conductors; said first and second decode means and said output sense means; and
   (e) wherein said output sense means includes latching means comprising
      a pair of cross connected field effect transistors;
      a pair of load field effect transistors each operatively connected to one of said cross connected field effect transistors;
      a sense node connected to said third series of conductors, to the source of one load field effect transistor and to the gating electrode of the cross connected field effect transistor associated with the other of said load field effect transistors; and
      a set/reset field effect transistor with its drain connected to said sense node, its source connected to the drain of said cross connected field effect transistor associated with said one load field effect transistor and the gating electrode connected to said clock means.

* * * * *